(12) United States Patent
Fan et al.

(10) Patent No.: US 7,593,496 B2
(45) Date of Patent: Sep. 22, 2009

(54) PHASE INTERPOLATOR

(75) Inventors: Yongping Fan, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 708 days.

(21) Appl. No.: 11/319,879

(22) Filed: Dec. 27, 2005

(65) Prior Publication Data

US 2007/0147564 A1  Jun. 28, 2007

(51) Int. Cl.
 *H04L 7/00* (2006.01)
(52) U.S. Cl. .................. 375/355; 375/316; 375/362; 327/231; 327/233; 331/25
(58) Field of Classification Search ................ 375/355, 375/316, 362; 327/141, 158, 231, 233; 331/25
 See application file for complete search history.

(56) References Cited

U.S. PATENT DOCUMENTS

| | | | |
|---|---|---|---|
| 6,249,164 B1 | 6/2001 | Cranford, Jr. et al. | |
| 6,563,387 B2 | 5/2003 | Hirano et al. | |
| 6,621,314 B2 | 9/2003 | Krishnamurty | |
| 6,661,272 B2* | 12/2003 | Kim et al. | 327/291 |
| 6,791,388 B2 | 9/2004 | Buchwald et al. | |
| 6,943,606 B2 | 9/2005 | Dunning et al. | |
| 2002/0161522 A1* | 10/2002 | Cohen et al. | 701/213 |
| 2003/0002607 A1 | 1/2003 | Mooney et al. | |
| 2003/0218486 A1* | 11/2003 | Kwak | 327/158 |
| 2004/0027181 A1* | 2/2004 | Watanabe | 327/156 |
| 2004/0263227 A1 | 12/2004 | Baker et al. | |
| 2005/0073344 A1 | 4/2005 | Furuya | |
| 2006/0232315 A1* | 10/2006 | Lee | 327/261 |

FOREIGN PATENT DOCUMENTS

| EP | 1093228 A | 4/2001 |
|---|---|---|
| WO | WO 2007/075312 | 2/2008 |

OTHER PUBLICATIONS

Kreienkamp, R. et al., "A 10-Gb/s CMOS Clock and Data Recovery Circuit With an Analog Phase Interpolator," IEEE Journal of Solid-State Circuits, vol. 40, No. 3, Mar. 2005, pp. 736-743.
U.S. Appl. No. 11/232,840, filed Sep. 21, 2005.
PCT/US2006/047110, PCT International Preliminary Report on Patentability and Written Opinion of the International Searching Authority, mailed Jul. 1, 2008, 8 pages.

* cited by examiner

*Primary Examiner*—Mohammad H Ghayour
*Assistant Examiner*—Leila Malek
(74) *Attorney, Agent, or Firm*—Blakely, Sokoloff, Taylor & Zafman LLP

(57) ABSTRACT

A phase interpolator includes a first circuit to generate a first signal having a first phase delay and a second signal having a second phase delay and a phase mixer. The phase mixer is coupled to receive the first and second signals from the first circuit. The phase mixer includes multiple current drivers each including a current driver input coupled to selectively delay one of the first or second signals and a current driver output coupled to output a phase delayed signal. The current driver outputs of the current drivers are coupled together to combine the phase delayed signals from the current drivers to generate an output phase delayed signal having a phase interpolated from the first and second signals.

17 Claims, 8 Drawing Sheets

PISEL CODING FOR DECODER

| PISEL <5:3> | MUX_SEL_1 <3:0> | MUX_SEL_2 <3:0> |
|---|---|---|
| 000 | 0001 (PH0) | 0001 (PH45) |
| 001 | 0010 (PH90) | 0001 (PH45) |
| 010 | 0010 (PH90) | 0010 (PH135) |
| 011 | 0100 (PH180) | 0010 (PH135) |
| 100 | 0100 (PH180) | 0100 (PH225) |
| 101 | 1000 (PH270) | 0100 (PH225) |
| 110 | 1000 (PH270) | 1000 (PH315) |
| 111 | 0001 (PH0) | 1000 (PH315) |

FIG. 3A

THERMOMETER CODING FOR PHASE MIXER

| PISEL <2:0> | PISEL <3> | PMSEL <7:0> |
|---|---|---|
| 000 | 0 | 00000000 |
| 001 | 0 | 00000001 |
| 010 | 0 | 00000011 |
| 011 | 0 | 00000111 |
| 100 | 0 | 00001111 |
| 101 | 0 | 00011111 |
| 110 | 0 | 00111111 |
| 111 | 0 | 01111111 |
| 000 | 1 | 11111111 |
| 001 | 1 | 11111110 |
| 010 | 1 | 11111100 |
| 011 | 1 | 11111000 |
| 100 | 1 | 11110000 |
| 101 | 1 | 11100000 |
| 110 | 1 | 11000000 |
| 111 | 1 | 10000000 |
| 000 | 0 | 00000000 |

FIG. 3B

PHASE INTERPOLATOR

TECHNICAL FIELD

This disclosure relates generally to electronic circuits, and in particular but not exclusively, relates to phase interpolators.

BACKGROUND INFORMATION

In many data communication configurations, no separate clock signal is communicated between a transmitter of a data stream and a receiver of the data stream. This requires recovering the clock from the data stream at the receiving end in order to then recover the data. This problem often arises when transferring digital data across one or more clock timing domains. It is not unusual to transmit digital data between clock timing domains having nearly the same underlying frequency clock, but different or varying phases with respect to each other.

The receiving end can derive a sampling signal from the data stream, and then use the sampling signal to sample the received data at sample times that produce optimal data recovery. In this way, data recovery errors can be minimized. Precision timing control techniques are desirable to achieve and maintain optimal sampling times, especially when the received data stream has high data rates, such as multi-giga-bit-per-second data rates. Such timing control includes control of the phase and frequency of a sampling signal used to sample the received data signal.

As received data rates increase into the multi-gigabit-per-second range, the difficulty to effectively control the sampling phase in the receiver correspondingly increases. This problem is further aggravated at multi-gigabit frequencies since the data eye width (the period of time during which the received data is valid for sampling) decreases with increasing frequency.

Phase interpolators are often used to precisely position the sampling phase at the center of the received data eye. To maximize the setup and hold time margin, the sampling clock should be positioned with high precision and jitter minimized. Additionally, since chip performance is becoming limited by power delivery, reducing power consumption of a phase interpolator helps achieve high performance sampling.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 3A is a table illustrating a coding scheme for a phase interpolator select signal, in accordance with an embodiment of the invention.

FIG. 3B is a table illustrating a thermometer coding scheme for a phase mixer select signal, in accordance with an embodiment of the invention.

DETAILED DESCRIPTION

Embodiments of an apparatus and method for phase interpolation are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
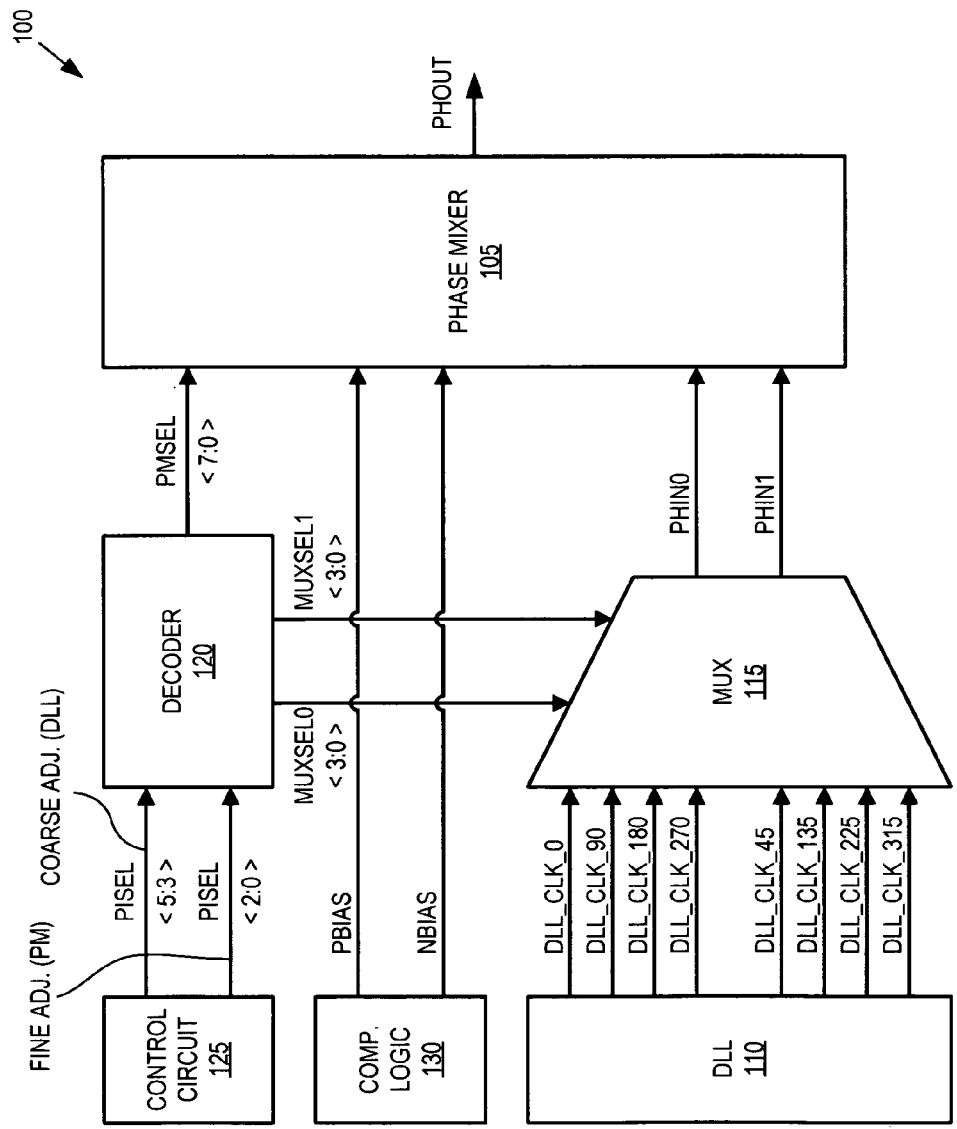
FIG. 1 is a functional block diagram illustrating a phase interpolator, in accordance with an embodiment of the invention.

FIG. 1 is a functional block diagram illustrating a phase interpolator ("PI") 100, in accordance with an embodiment of the invention. The illustrated embodiment of PI 100 includes a phase mixer 105, a delay lock loop ("DLL") 110, a multiplexer ("MUX") 115, a decoder 120, a control circuit 125, and compensation logic 130.

Phase interpolation is used to extract a number of intermediate phases from a clock signal. PI 100 implements a phase interpolation function, which may be used in connection with a variety of applications. For example, PI 100 may be used to precisely position a sampling phase at the center of an eye width of a received data stream.

Figure 2:
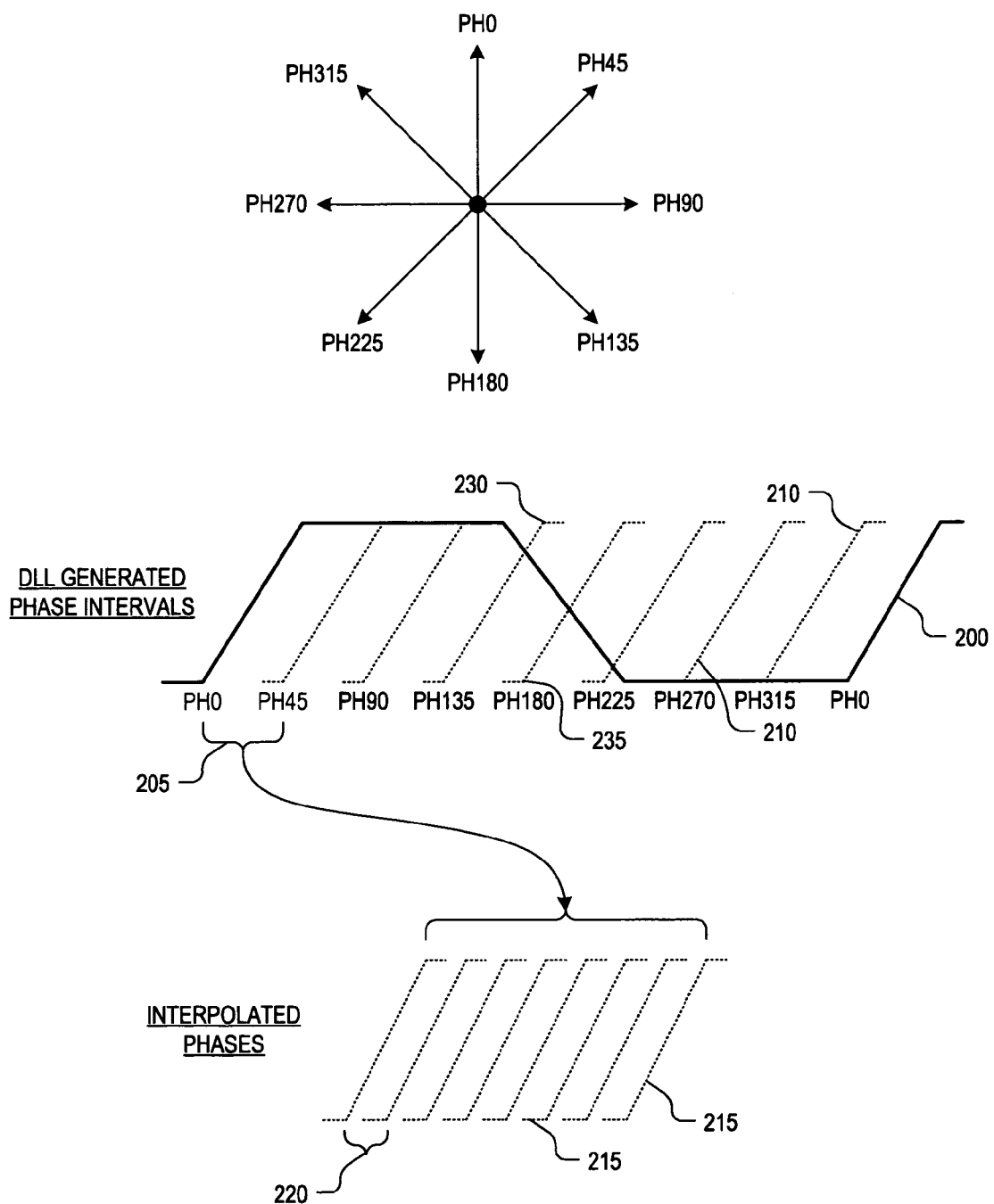
FIG. 2 includes phase diagrams for illustrating phase interpolation, in accordance with an embodiment of the invention.

Referring to FIG. 2, a clock signal 200 is illustrated. Clock signal 200 is divided into eight evenly spaced phase intervals 205 (only one is labeled) ranging from 0° to 45°, 45° to 90°, 90° to 135°, 135° to 180°, 180° to 225°, 225° to 270°, 270° to 315°, and 315° to 360°. Phase delayed signals 210 (only a portion are labeled) having phase intervals 205 may be generated from clock signal 200 using a DLL, such as DLL 110. Accordingly, in one embodiment, DLL 110 generates eight DLL clock signals (DLL_CLK_0, DLL_CLK_45, DLL_CLK_90, DLL_CLK_135, DLL_CLK_180, DLL_CLK_225, DLL_CLK_270, and DLL_CLK_315) from clock signal 200 each having a different phase delay. It should be appreciated that DLL 110 may generate more or less DLL clock signals and phase intervals 205 between the DLL clock signals need not be uniform. However, if it is desired to extract a greater number of phase delayed signals from clock signal 200 beyond that reasonably extractable from DLL 110, then phase interpolation between the DLL clock signals may be used to achieve greater phase granularity.

Phase interpolation implemented by PI 100 may be used to extract phase delayed signals 215 having finer phase intervals 220 than the coarse phase intervals 205. In the illustrated embodiment, eight phase delayed signals 215 having uniformly spaced phase intervals 220 are illustrated; however, it should be appreciated that other embodiments may interpolate more or less phase delayed signals 215 having uniformly or non-uniformly spaced phase intervals 220.

In general, to achieve uniformly spaced phase intervals 220 from phase interpolation, the two signals being interpolated should have overlapping waveforms. For example, if interpolation is used to extract finer spaced phase delayed signals between DLL_CLK_135 and DLL_CLK_180, then the phase of leading edge 230 of DLL_CLK_135 should overlap the phase of lagging edge 235 of DLL_CLK_180. Accordingly, in one embodiment, the number of coarse phase delay signals 210 generated by DLL 110 is selected based on the rise time of signal 200 to achieve overlapping edges.

Returning to FIG. 1, the illustrated components of PI 100 are interconnected as follows. Control circuit 125 is coupled to decoder 120 to provide decoder 120 with a phase interpolator select ("PISEL") signal. The PISEL signal is output by control circuit 125 to select the specific weighted phase delayed signal ("PHOUT") output from phase mixer 105. In the illustrated embodiment, the PISEL signal is a 6-bit binary coded signal. Control circuit 125 may be a state machine, a processor running executable code, or otherwise.

Decoder 120 is further coupled to phase mixer 105 and MUX 115. Decoder 120 decodes the PISEL signal, and in response, outputs a MUXSEL0 signal and a MUXSEL1 signal to MUX 115 and a phase mixer select ("PMSEL") signal to phase mixer 105. The MUXSEL0 signal selects which one of the DLL clock signals is forwarded to the output of MUX 115 as the phase input signal (PHIN0) to phase mixer 105. Correspondingly, the MUXSEL1 signal selects which one of the DLL clock signals is forwarded to the output of MUX 115 as the phase input signal (PHIN1) to phase mixer 105. An exemplary coding of the PISEL signal and the MUXSEL0 and MUXSEL1 signals is listed in table 405, illustrated in FIG. 3A.

The PMSEL signal is coupled into phase mixer 105 from decoder 120 to configure internal circuitry of phase mixer 105 for selective interpolation between PHIN0 and PHIN1. In one embodiment, the PMSEL signal sets weighting factors for how the two signals PHIN0 and PHIN1 are combined to generate a weighted phase delayed signal (PHOUT) output from phase mixer 105. In other words, the PMSEL signal determines the amount of interpolation between the phases of PHIN0 and PHIN1 by setting the weighting factors α and β when combining the phase delays of the two signals PHIN0 and PHIN1. Phase mixer 105 generates weighted phase delayed signal PHOUT by mixing a weighted combination of PHIN0 and PHIN1. In one embodiment, the output phase of the weighted phase delayed signal PHOUT is related to the phases of the input signals PHIN0 and PHIN1 accordingly to relation 1, $$\angle PHOUT = \alpha \cdot (\angle PHIN0) + \beta \cdot (\angle PHIN1) \quad \text{(Relation 1)}$$

where $\angle PHOUT$ represents the phase of PHOUT, $\angle PHIN0$ represents the phase of PHIN0, $\angle PHIN1$ represents the phase on PHIN1, and wherein $\alpha + \beta = 1$. In one embodiment, phase mixer 105 generates PHOUT having $\angle PHOUT$ via weighted phase interpolation between $\angle PHIN0$ and $\angle PHIN1$.

Compensation logic 130 is coupled to phase mixer 105 to provide compensation signals NBIAS and PBIAS thereto. The NBIAS and PBIAS signals are coupled into phase mixer 105 to compensate for changes in a variety of factors (e.g., operating temperature, process technology (e.g., transistor types, sizes, and materials), operation voltage, etc.) to maintaining relatively constant phase interpolation (e.g., size of phase intervals 210) despite changes in these factors. In one embodiment, the PBIAS signal is coupled into phase mixer 105 to regulate the conductivity of various pull up paths within phase mixer 105 while the NBIAS signal regulates the conductivity of various pull down paths within phase mixer 105.

Figure 4:
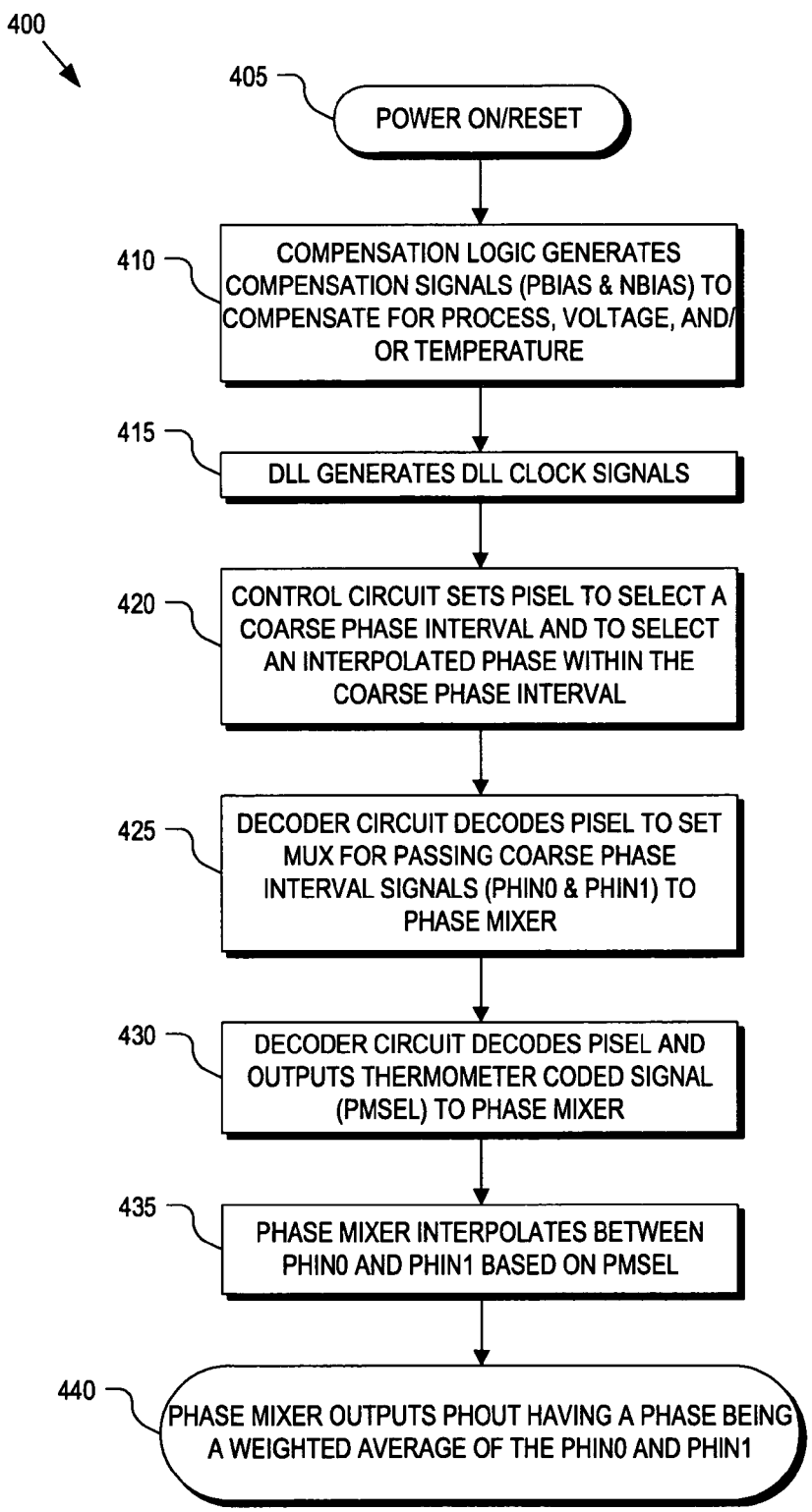
FIG. 4 is a flow chart illustrating a process of operation of a phase interpolator, in accordance with an embodiment of the invention.

FIG. 4 is a flow chart illustrating a process 400 for operation of PI 100, in accordance with an embodiment of the invention. The order in which some or all of the process blocks appear should not be deemed limiting. Rather, one of ordinary skill in the art having the benefit of the present disclosure will understand that some of the process blocks may be executed in a variety of orders not illustrated.

In a process block 405, power is applied to PI 100 and/or PI 100 is reset. In a process block 410, compensation logic 130 generates the PBIAS and NBIAS signals for biasing the pull up and pull down paths within phase mixer 105. The PBIAS and NBIAS signals are generated by compensation logic 130 to maintain a relatively constant magnitude of PHOUT despite fluctuations in the operating voltage and temperature of PI 100. Additionally, the PBIAS and NBIAS signals are used to compensate for different process technologies with which embodiments of PI 100 may be implemented. Compensation logic 130 may be implemented external to DLL 110, as illustrated or may be physically implemented internal to DLL 110 as a subcomponent thereof. In one embodiment, the NBIAS signal is derived from a charge pump output of DLL 110. Alternatively, PBIAS and NBAIS may simply be generated by application of fixed voltages.

In a process block 415, DLL 110 generates the DLL clock signals from clock signal 200. In the illustrated embodiment, DLL 110 generates eight DLL clock signals DLL_CLK_0, DLL_CLK_45, DLL_CLK_90, DLL_CLK_135, DLL_CLK_180, DLL_CLK_225, DLL_CLK_270, and DLL_CLK_315 having evenly spaced phase delays 0°, 45°, 90°, 135°, 180°, 225°, 270°, and 315°, respectively. In other embodiments, DLL 110 may generate more or less DLL clock signals from clock signal 200. It should be appreciated that in some embodiments, the generation of the DLL clock signals and the generation of the PBIAS and NBIAS compensation signals may occur simultaneously. Accordingly, process blocks 410 and 415 may occur contemporaneously.

In a process block 420, control circuit 125 sets the PISEL signal to select a coarse phase interval and to select the interpolated phase within the coarse phase interval. In one embodiment, the PISEL signal is coded such that the three most significant bits ("MSB") are used to select the coarse phase interval (e.g., any of phase intervals 205) while the three least significant bits ("LSB") are used to select the interpolated phase (e.g., any of phase delayed signals 215) between the selected coarse phase interval. In essence, the three MSBs act as a coarse phase adjustment and the three LSBs act as a fine phase adjustment.

In a process block 425, the three MSBs <5:3> of the PISEL signal are decoded by decoder 120 to generate the MUXSEL0 and MUXSEL1 signals. The MUXSEL0 signal configures MUX 115 to select which one of the DLL signals is passed through MUX 115 as the PHIN0 signal. The MUXSEL1 signal configures MUX 115 to select which one of the DLL signals is passed through MUX 115 as the PHIN1 signal. The two PHIN0 and PHIN1 signals are output from MUX 115 to phase mixer 105. Although MUX 115 is illustrated as a single 8×2 multiplexer block, it should be appreciated that MUX 115 may represent two separate and physically independent 4×1 multiplexers.

In a process block 430, the three LSBs <2:0> of the PISEL signal are decoded by decoder 120 to generate the PMSEL signal. The PMSEL signal is coupled into phase mixer 105 to select the interpolated phase between PHIN0 and PHIN1. In one embodiment, the PMSEL signal is a thermometer coded signal as illustrated in FIG. 3B (discussed below). In a process block 435, phase mixer 105 interpolates between PHIN0 and PHIN1 according to the PMSEL signal and generates the weighted phase delayed signal PHOUT.

Figure 5:
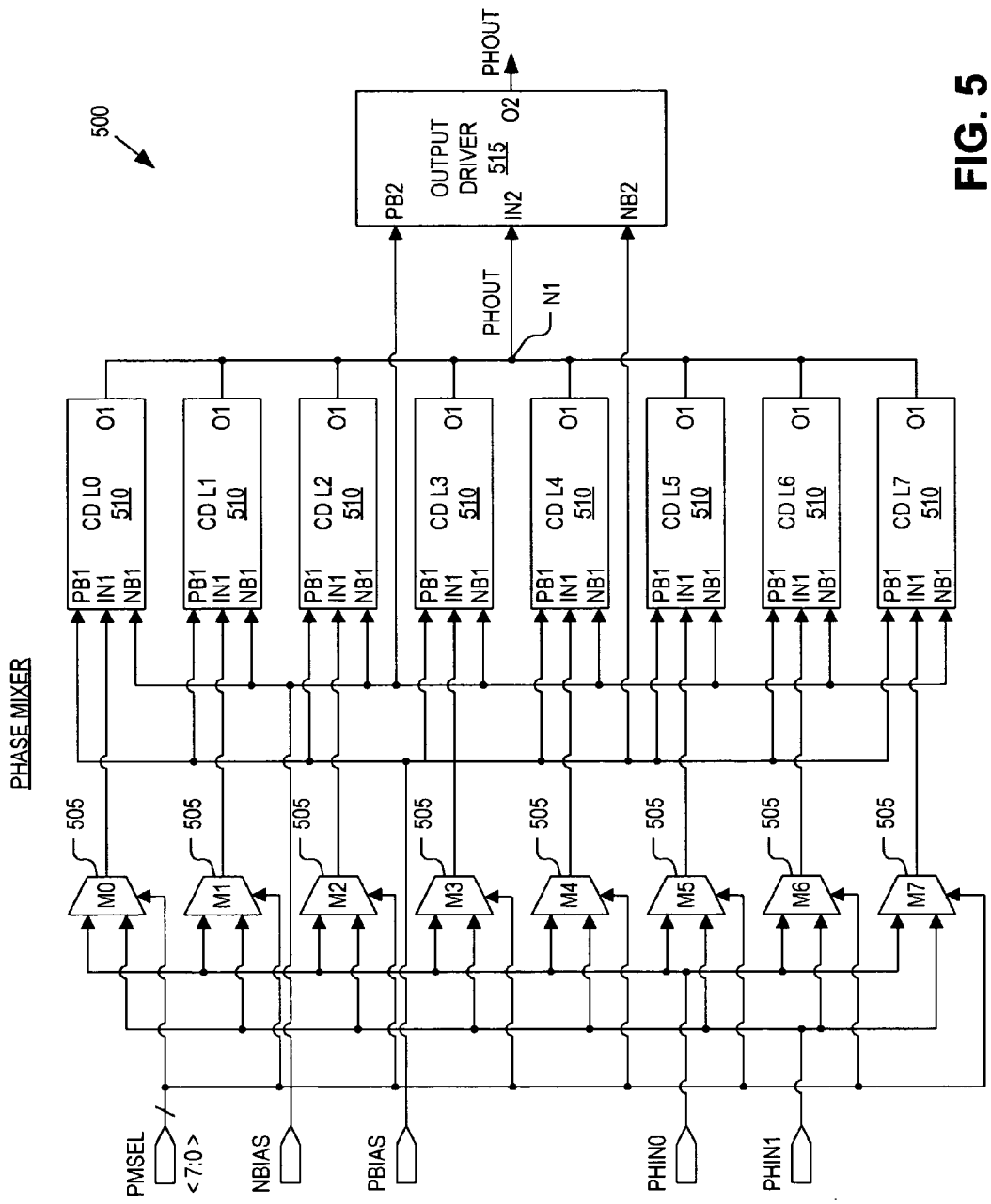
FIG. 5 is a functional block diagram illustrating a phase mixer, in accordance with an embodiment of the invention.

FIG. 5 is a functional block diagram illustrating a phase mixer 500, in accordance with an embodiment of the invention. Phase mixer 500 is one possible embodiment of phase mixer 105 illustrated in FIG. 1. The illustrated embodiment of phase mixer 500 includes multiplexers M0 through M7 (collectively MUXs 505), current drivers ("CDs") L0 through L7 (collectively CDs 510), and an output driver 515. CDs 510 may also be referred to as current driver legs.

The components of phase mixer 500 are interconnected as follows. MUXs 505 each include two input ports, an output port, and a control port. One of the input ports of each MUX 505 is coupled to MUX 115 to receive PHIN0 while the other input port is coupled to MUX 115 to receive PHIN1. The control port of each MUX 505 is coupled to receive one bit of the PMSEL signal. In the illustrated embodiment, the PMSEL signal is an 8-bit signal, each bit corresponding to the control port of one of MUXs 505. The control port of each MUX 505 selects which input port is coupled to the output port in response to the PMSEL signal.

CDs 510 each include an input port (IN1), an output port (O1), a Pbias port (PB1), and an Nbias port (NB1). The output ports of MUXs 505 are each coupled to corresponding input ports IN1. Pbias ports PB1 are coupled to receive the PBIAS signal from compensation logic 130 and Nbias ports NB1 are coupled to receive the NBIAS signal from compensation logic 130. Output ports O1 of CDs 510 are coupled to a single node N1.

Output driver 515 includes an input port (IN2), an output port (O2), a Pbias port (PB2), and an Nbias port (NB2). Input port IN2 is coupled to node N1 and therefore to output ports O1 of all CDs 510. Pbias port PB2 and Nbias port NB2 are coupled to receive the PBIAS and NBIAS signals from compensation logic 130, respectively.

During operation, each MUX 505 selectively passes one of the PHIN0 and PHIN1 signals to its corresponding CD 510 based on the PMSEL signal. Accordingly, some CDs 510 may receive PHIN0 having a first phase (∠PHIN0) and some CDs 501 may receive PHIN1 having a second phase (∠PHIN1). In one embodiment, the PMSEL signal is a thermometer coded signal, as illustrated in FIG. 3B. In the illustrated embodiment, each bit position of the PMSEL signal controls one of MUXs 505 and therefore determines whether each CD 510 is coupled to receive PHIN0 having a phase ∠PHIN0 or PHIN1 having a phase ∠PHIN1.

CDs 510 each output a phase delayed current that is combined with the phase delayed current from the other CDs 510 at node N1. The combined phase delayed currents generate the weighted phase delayed signal PHOUT having a phase ∠PHOUT interpolated from a weighted combination of the phases ∠PHIN0 and ∠PHIN1. Accordingly, if the PMSEL signal is such that a majority of CDs 510 receive PHIN0, then the interpolated phase ∠PHOUT of PHOUT will be closer to PHIN0. If the PMSEL signal is such that a majority of CDs 510 receive PHIN1, then the interpolated phase ∠PHOUT of PHOUT will be closer to PHIN1.

In one embodiment, CDs 510 are designed such that the following relations are true, $$\angle PHOUT = \alpha \cdot (\angle PHIN0) + \beta \cdot (\angle PHIN1) \quad \text{(Relation 2)}$$

$$\angle PHOUT = \frac{x}{N} \cdot (\angle PHIN0) + \frac{y}{N} \cdot (\angle PHIN1) \quad \text{(Relation 3)}$$

$$\alpha = \frac{x}{N} \quad \text{(Relation 4)}$$

$$\beta = \frac{y}{N} \quad \text{(Relation 5)}$$

$$x + y = N \quad \text{(Relation 6)}$$

where N equals the total number of CDs 510 (eight illustrated in FIG. 5), x represents the number of CDs 510 coupled to receive PHIN0 via MUXs 505, and y represents the number of CDs 510 coupled to receive PHIN1 via MUXs 505. Accordingly, $\alpha$ and $\beta$ are selectable weighting factors for combining ∠PHIN0 and ∠PHIN1 according to the selected value of the PMSEL signal. In one embodiment, the output drive strengths of CDs 510 are designed such that the phase delayed currents output by CDs 510 can be selectively combined at node N1 to create substantially equal phase interpolated intervals 220 between ∠PHIN0 and ∠PHIN1.

Figure 6:
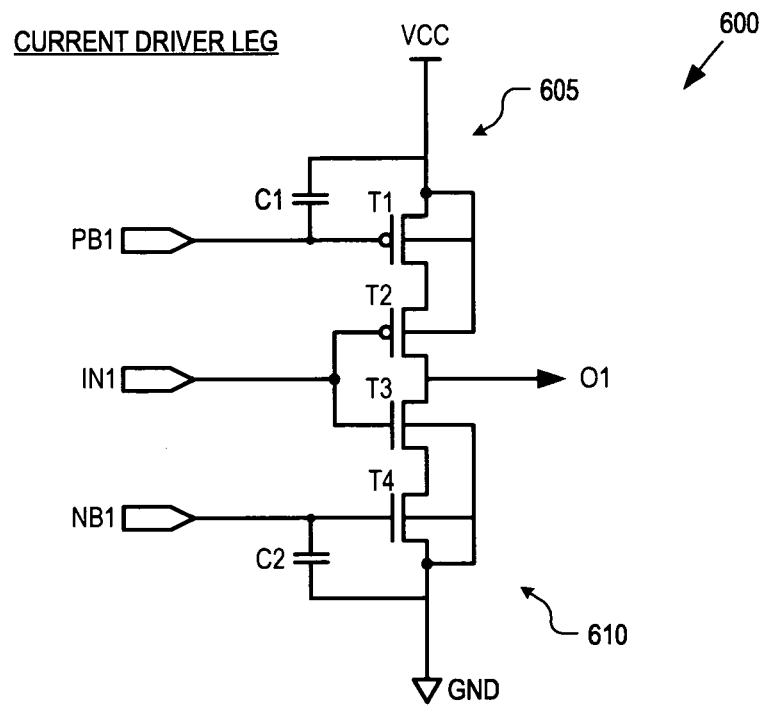
FIG. 6 is a circuit diagram illustrating a current driver leg, in accordance with an embodiment of the invention.

FIG. 6 is a circuit diagram illustrating a current driver ("CD") leg 600, in accordance with an embodiment of the invention. CD leg 600 is one possible embodiment of CDs 510 illustrated in FIG. 5. The illustrated embodiment of CD leg 600 includes four transistors T1, T2, T3, and T4 coupled in series between a high voltage rail VCC and a low voltage rail GND. Transistors T1 and T2 are positive metal oxide semiconductor ("PMOS") transistors and transistors T3 and T4 are negative metal oxide semiconductor ("NMOS") transistors. The gates of T2 and T3 are coupled together forming an inverter-like structure between input port IN1 and output port O1. The gate of transistor T1 is coupled to PBIAS port PB1 to receive the PBIAS signal from compensation logic 130. The gate of transistor T4 is coupled to Nbias port NB1 to receive the NBIAS signal from compensation logic 130.

Transistor T1 acts to control the conductivity of the pull up path 605 in response to the PBIAS signal. Similarly, transistor T4 acts to control the conductivity of the pull down path 610 in response to the NBIAS signal. By controlling the conductivity of the pull up and pull down paths, the PBIAS and NBIAS signals can compensate for fluctuations in operation temperature and voltage, and different fabrication process technologies, to maintain the drive current at output port O1 substantially constant across these changing factors. For example, if the operation temperature of PI 100 increases during operation, then compensation logic 130 may decrease the voltage of the PBIAS signal and increase the voltage of NBIAS signal to maintain a constant magnitude of the phase delayed current at output port O1.

As mentioned above, in some embodiments, CDs 510 are configured to generate substantially equal interpolated phase intervals 220 in response to a weighted thermometer coding of the PMSEL signal. Table 1 below illustrates example relative sizes of transistors T1 and T4 to achieve substantially equivalent interpolated phase intervals 220 using a weighted thermometer coding for the PMSEL signal.

TABLE 1

| CD LEG | T4 RELATIVE SIZE | T1 RELATIVE SIZE |
|---|---|---|
| L0 | 1x | 1.6x |
| L1 | 0.75x | 1.2x |
| L2 | 0.75x | 1.2x |
| L3 | 0.9x | 1.4x |
| L4 | 1.1x | 1.8x |
| L5 | 1.6x | 2.6x |
| L6 | 3.0x | 4.8x |
| L7 | 5.5x | 8.8x |

Table 1 illustrates example relative sizes of transistors T1 and T4 for an operational frequency approximately equal to 3.2 GHz of clock signal 200.

As illustrated, CD leg 600 may be fabricated using standard complimentary metal oxide semiconductor ("CMOS") technology. As such, CD leg 600 consumes little power, and that power that it does consume is primarily consumed during switching (dynamic power consumption). In other words, CD leg 600 consumes little static power, due to its CMOS compatibility. Accordingly, PI 100 provides a low power, high frequency, phase interpolation function. Prior art phase interpolates are typically implemented using differential signaling and therefore consume substantially more power than PI 100 (both dynamic and static power consumption), as well as, appropriately designing the relative sizes of the transistors in pull up path 605 and pull down path 610.

In one embodiment, CDs 510 are matched current drivers. CDs 510 are matched in the sense that the magnitude of the combined current through node N1 when node N1 is being pulled down via pull down paths 610 of each CD 510 is substantially equivalent to the magnitude of the combined current through node N1 when node N1 is being pulled up via pull up paths 605 of each CD 510. In other words, in this embodiment, the rise time and fall time of phase delayed signals 215 generated by phase mixer 105 are substantially symmetric, since the magnitude of the combined drive current through node N1 generated by CDs 510 is substantially equal during the rising and falling stages of the weighted phase delayed signal PHOUT. In one embodiment, matching the rising and falling times of PHOUT can be achieved via appropriate bias of the PBIAS and NBIAS signals.

In the illustrated, CD leg 600 includes shunt capacitors C1 and C2 coupled across the gate and source of transistors T1 and T4, respectively. These shunt capacitors reduce jitter on PHOUT by filtering noise on high voltage rail VCC and low voltage rail GND. If a noise spike is propagated on high voltage rail VCC, then shunt capacitor C1 will pass that noise spike onto the gate of transistor T1 thereby maintaining a constant gate-source voltage Vgs on transistor T1 and maintaining the conductivity of pull up path 605 relatively constant. Similarly, if a noise spike is propagated on low voltage rail GND, then shunt capacitor C2 will pass that noise spike onto the gate of transistor T4 thereby maintaining a constant gate-source voltage Vgs on transistor T4 and maintaining the conductivity of pull down path 610 relatively constant. In this manner, shunt capacitors C1 and C2 act to isolate output port O1 from noise propagated on the voltage rails and bias ports PB1 and NB1.

Figure 7:
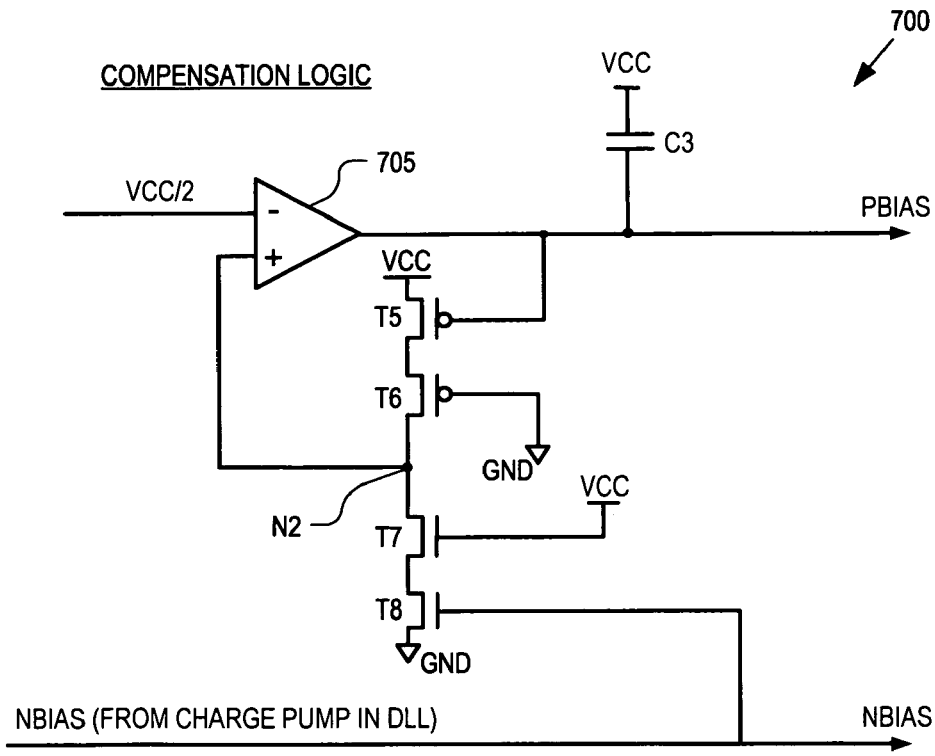
FIG. 7 is a circuit diagram illustrating compensation logic for generating a PMOS bias signal, in accordance with an embodiment of the invention.

FIG. 7 is a circuit diagram illustrating compensation logic 700 for generating the PBIAS signal, in accordance with an embodiment of the invention. The illustrated embodiment of compensation logic 700 is one possible embodiment for compensation logic 130 illustrated in FIG. 1. The illustrated embodiment of compensation logic 700 includes a comparator 705 and transistors T5, T6, T7, and T8 coupled in series between the high voltage rail VCC and the low voltage rail GND. The negative input of comparator 705 is coupled to receive a voltage equal to half the voltage supplied by the high voltage rail (i.e., VCC/2). A simply voltage divider circuit may be used to generate VCC/2. The positive input of comparator 705 is coupled to an intermediate node N2 between the drains of transistor T6 and T7. The gate of transistor T5 is coupled to the output of comparator 705, the gate of transistor T6 is coupled to the low voltage rail, the gate of transistor T7 is coupled to the high voltage rail, and the gate of transistor T8 is coupled to receive the NBIAS signal from the charge pump (not illustrated) of DLL 110. A capacitor C3 is further coupled between the output of comparator 705 and the high voltage rail VCC.

Figure 8A:
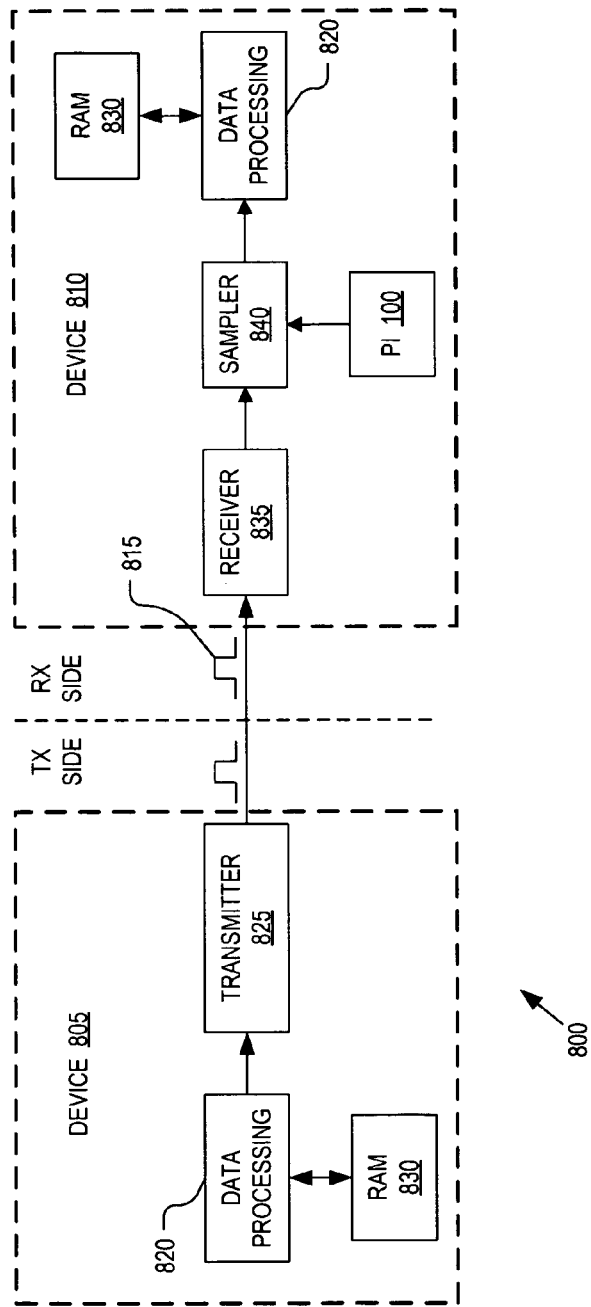
FIG. 8A is a functional block diagram illustrating a system for implementing an embodiment of the invention.

FIG. 8A is a functional block diagram illustrating a system 800 for implementing an embodiment of the invention coupled to communicate with each other. System 800 includes two devices 805 and 810. Devices 805 and 810 may represent any processing devices including computers, network elements (e.g., switches, routers, etc.), portable communication devices (e.g., cell phone) and the like. Device 805 includes a data processing unit 820 (e.g., microprocessor, central processing unit, etc.), a transmitter 825, and random access memory ("RAM") 830. Device 810 includes a data processing unit 820, RAM 830, a receiver 835, a sampler 840, and PI 100. RAMs 830 may include RAM types such as dynamic RAM ("DRAM"), synchronous DRAM ("SDRAM"), double data rate SDRAM ("DDR SDRAM"), static RAM ("SRAM"), and the like.

As illustrated, device 805 transmits a data stream 815 output from transmitter 825 to device 810. Data stream 815 is received by receiver 835 and sampled by sampler 840. Sampler 840 samples the received data stream 815 at specified sample times or sample phases to extract sampled data, and forwards the sampled data to data processing unit 820. PI 100 is coupled to sampler 840 to precisely set the sampling phase of sampler 840.

Figure 8B:
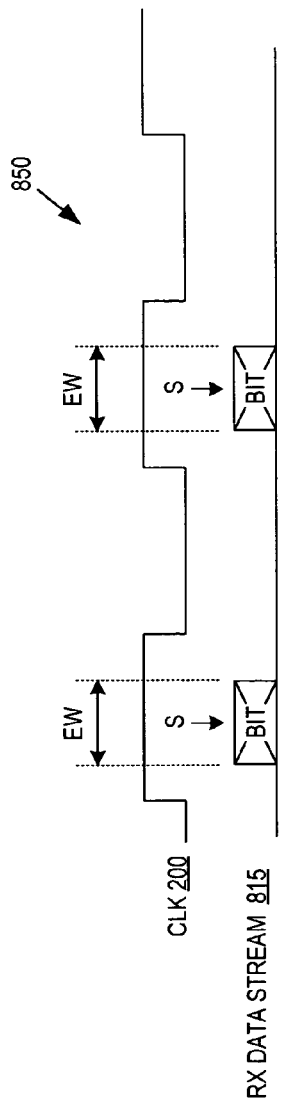
FIG. 8B is a timing diagram illustrating sampling of a received data stream, in accordance with an embodiment of the invention.

Referring to timing diagram 850 illustrated in FIG. 8B, to optimize recovery of data from data stream 815, the sample time or sample phase 'S' should be centered in the middle of the eye width ("EW") of the received data stream 815. Clock signal 200 may be extracted from received data stream 815 or independently generated by device 810. However, since the rising or falling edge of clock signal 200 typically will not fall at the center of the EW, PI 100 is used to generate intermediate phases for precisely aligning the sample phase S of sampler 840 with the center of the EW of received data stream 815.

Figure 9:
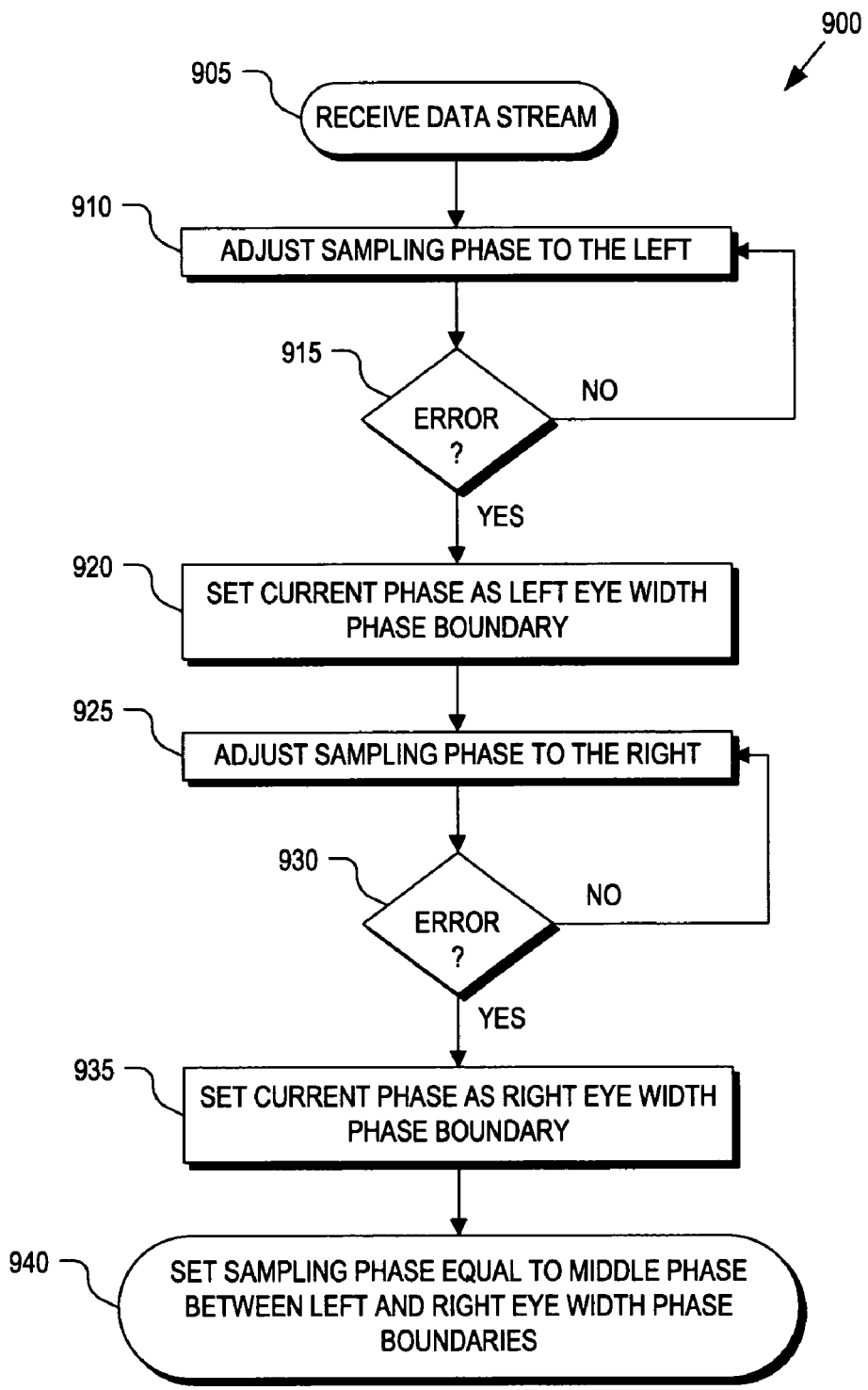
FIG. 9 is a flow chart illustrating a process for determining a sampling phase, in accordance with an embodiment of the invention.

FIG. 9 is a flow chart illustrating a process 900 for aligning the sampling phase S with the center of the EW of data stream 815, in accordance with an embodiment of the invention. In a process block 905 data stream 815 is received at device 810. In a process block 910, PI 100 adjusts the sampling phase S to one direction (e.g., left) until data stream 815 is no longer validly sampled (decision block 915). At the point where received data stream 815 is no longer validly sampled by sampler 840, the current phase setting of PI 100 is set as the left phase boundary of the EW (process block 920). In a process block 925, PI 100 adjusts the sampling phase S to the other direction (e.g., right) until data stream 815 is no longer validly sampled (decision block 930). At the point where received data stream 815 is again no longer validly sampled by sampler 840, the current phase setting of PI 100 is set as the right phase boundary of the EW (process block 935). The optimal sampling phase is then set at the midway point between the right and left phase boundaries of the EW. Process 900 may be periodically re-executed during communication sessions between devices 805 and 810 to compensate for relative phase drifts between the two devices.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A phase interpolator, comprising:
    a first circuit to output a first signal having a first phase delay and a second signal having a second phase delay; and
    a phase mixer coupled to receive the first and second signals from the first circuit, the phase mixer including:
        multiple current drivers each including a current driver input coupled to selectively delay one of the first or second signals and a current driver output coupled to output a phase delayed signal, the current driver outputs of the current drivers coupled together to combine the phase delayed signals from the current drivers to generate an output phase delayed signal having a phase interpolated from a selectable weighted combination of the first and second phase delays; and
        multiple first multiplexers each coupled to one of the current drivers, the first multiplexers each coupled to receive the first and second signals and coupled to independently selectively pass either the first signal or the second signals to the current driver input of a corresponding one of the current drivers, the first multiplexers each responsive to a phase mixer select ("PMSEL") signal to collectively set the selectable weighted combination of the first and second phase delays.

2. The phase interpolator of claim 1, wherein the first multiplexers are coupled to selectively pass one of the first or second signals responsive to the PMSEL signal having a thermometer coding and wherein the outputs of the current drivers are coupled together to combine the phase delayed signals to generate the output phase delayed signal having a phase interpolated from the selectable weighted combination of the first an second phase delays.

3. The phase interpolator of claim 1, wherein each of the current drivers comprises:
    a pull up path including first and second transistors coupled in series, the pull up path coupled between and the current driver output and a first voltage rail; and
    a pull down path including third and fourth transistors coupled in series, the pull down path coupled between the current driver output and a second voltage rail, wherein gates of the second and third transistors are coupled to the current driver input.

4. The phase interpolator of claim 3, wherein a gate of the first transistor is coupled to receive a pull up path bias signal and a gate of the fourth transistor is coupled to receive a pull down path bias signal, the phase interpolator further comprising compensation logic to generate the pull up path bias signal, the compensation logic comprising:
    fifth and sixth transistors coupled in series between a circuit node and the first voltage rail;
    seventh and eighth transistors coupled in series between the circuit node and the second voltage rail; and
    a comparator having a negative input coupled to receive half the voltage of the first voltage rail, a positive input coupled to the circuit node, and an output to generate the pull up path bias signal, wherein the output of the comparator is further coupled to a gate of the fifth transistor and wherein a gate of the eighth transistor is coupled to receive the pull down path bias signal.

5. The phase interpolator of claim 3, wherein each of the current drivers further comprises:
    a first capacitor coupled between the first voltage rail and a gate of the first transistor; and
    a second capacitor coupled between the second voltage rail and a gate of the fourth transistor, the first and second capacitors coupled to reduce perturbations of the phase delayed signal output on the current driver output due to noise on the first and second voltage rails.

6. The phase interpolator of claim 3, wherein the first and fourth transistors of each of the current drivers are sized to interpolate multiple substantially equal phase intervals between the first and second signals.

7. The phase interpolator of claim 6, wherein the first and fourth transistors of each of the current drivers are sized to interpolate the multiple substantially equal phase intervals between the first and second signals based on a weighted thermometer coding.

8. The phase interpolator of claim 1, wherein the first circuit comprises:
    a delay lock loop ("DLL") to generate a plurality of DLL clock signals each having a different phase; and
    a second multiplexer coupled to receive the plurality of DLL clock signals and to selectively pass two of the DLL clock signals as the first and second signals to the phase mixer.

9. The phase interpolator of claim 8, further comprising:
    a control circuit to generate a phase interpolator select ("PISEL") signal; and
    a decoder coupled to the control circuit, the phase mixer, and the multiplexer, the decoder coupled to decode the PISEL signal and to generate the PMSEL signal in response to the PISEL signal and to generate a multiplexer select ("MUXSEL") signal to control the multiplexer in response to the PISEL signal.

10. The phase interpolator of claim 9, wherein the decoder is coupled to output the PMSEL signal to the phase mixer as a weighted thermometer coded signal.

11. A method of operation, comprising:
    generating a first signal having a first phase and a second signal having a second phase;
    generating a phase mixer select signal;
    selectively passing one of the first or second signals to each of a plurality of current drivers in response to the phase mixer select signal;
    generating multiple phase delayed signals from the current drivers; and
    combining each of the phase delayed signals to generate a weighted phase delayed signal having a third phase interpolated from a weighted combination of the first and second phases,
    wherein generating the multiple phase delayed signals from the current drivers includes:
        sinking a first combined current through a common node coupled to each of the current drivers; and sourcing a second combined current through the common node coupled to each of the current drivers, wherein the first and second combined currents have a substantially equivalent magnitude to create a substantially equivalent rise and fall time of the weighted phase delayed signal.

12. The method of claim 11, further comprising:

generating a first bias signal to bias pull up paths within each of the current drivers; and generating a second bias signal to bias pull down paths within each of the current drivers, the first and second bias signals control conductivity of the pull up and pull down paths within each of the current drivers to maintain substantially constant first and second combined currents over an operating temperature range.

13. The method of claim 11, wherein generating the phase mixer select signal comprises generating a thermometer coded signal, and wherein selectively passing one of the first or second signals to each of the current drivers in response to the phase mixer select signal comprises selectively passing one of the first or second signals to each of the current drivers in response to the thermometer coded signal.

14. The method of claim 13, wherein the thermometer coded signal comprises a weighted thermometer coded signal for selecting the third phase of the weighted phase delayed signal from multiple phases having substantially equal phase intervals interpolated between the first and second signals.

15. A system, comprising:

a sampler to sample data received from a communication channel;

a data processing unit coupled to process the data received from the sampler and coupled to synchronous dynamic random access memory ("SDRAM"); and a phase interpolator coupled to the sampler to select a sampling phase of the sampler, the phase interpolator including:

a first circuit to output a first signal having a first phase delay and a second signal having a second phase delay; and a phase mixer coupled to receive the first and second signals from the first circuit, the phase mixer including:

multiple current drivers each including a current driver input coupled to selectively delay one of the first or second signals and a current driver output coupled to output a phase delayed signal, the current driver outputs of the current drivers coupled together to combine the phase delayed signals from the current drivers to generate an output phase delayed signal having a phase interpolated from a selectable weighted combination of the first and second signals; and multiple first multiplexers each coupled to one of the current drivers, the first multiplexers each coupled to receive the first and second signals and coupled to independently selectively pass either the first signal or the second signal to the current driver input of a corresponding one of the current drivers, the first multiplexers each responsive to a phase mixer select ("PMSEL") signal to collectively set the selectable weighted combination of the first and second phase delays.

16. The system of claim 15, wherein the first circuit comprises a delay lock loop ("DLL") to generate a plurality of DLL clock signals each having a different phase and a second multiplexer coupled to receive the plurality of DLL clock signals and to selectively pass two of the DLL clock signals as the first and second signals to the phase mixer, the phase interpolator further comprising:

a control circuit to generate a phase interpolator select ("PISEL") signal; and a decoder coupled to the control circuit, the phase mixer, and the multiplexer, the decoder coupled to decode the PISEL signal and to generate the PMSEL signal in response to the PISEL signal and to generate a multiplexer select ("MUXSEL") signal to control the multiplexer in response to the PISEL signal.

17. The system of claim 16, wherein the decoder is coupled to output the PMSEL signal to the phase mixer as a weighted thermometer coded signal.

* * * * *

UNITED STATES PATENT AND TRADEMARK OFFICE
CERTIFICATE OF CORRECTION

PATENT NO. : 7,593,496 B2
APPLICATION NO. : 11/319879
DATED : September 22, 2009
INVENTOR(S) : Fan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 936 days.

Signed and Sealed this

Twenty-first Day of September, 2010

David J. Kappos
*Director of the United States Patent and Trademark Office*